(12) United States Patent
Liu et al.

(10) Patent No.: US 9,276,046 B2
(45) Date of Patent: Mar. 1, 2016

(54) COLOR DISPLAY DEVICE STRUCTURE

(71) Applicant: Shenzhen China Star Optoelectronics Technology Co., Ltd., Shenzhen, Guangdong (CN)

(72) Inventors: Yawei Liu, Guangdong (CN); Yifan Wang, Guangdong (CN); Changcheng Lo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 20 days.

(21) Appl. No.: 14/384,672

(22) PCT Filed: Aug. 15, 2014

(86) PCT No.: PCT/CN2014/084451
§ 371 (c)(1),
(2) Date: Sep. 11, 2014

(65) Prior Publication Data
US 2016/0027848 A1 Jan. 28, 2016

(51) Int. Cl.
*H01L 27/00* (2006.01)
*H01L 27/32* (2006.01)
*H01L 51/52* (2006.01)
*H01L 51/50* (2006.01)
*H01L 27/12* (2006.01)

(52) U.S. Cl.
CPC .......... *H01L 27/322* (2013.01); *H01L 27/1214* (2013.01); *H01L 27/3213* (2013.01); *H01L 27/3244* (2013.01); *H01L 27/3262* (2013.01); *H01L 51/5024* (2013.01); *H01L 51/5036* (2013.01); *H01L 51/5237* (2013.01); *H01L 51/5246* (2013.01)

(58) Field of Classification Search
CPC .............. H01L 27/3244; H01L 27/322; H01L 27/1214; H01L 51/5237; H01L 51/5036; H01L 27/3262
See application file for complete search history.

(56) References Cited

U.S. PATENT DOCUMENTS

| 2002/0024096 A1* | 2/2002 | Yamazaki | H01L 27/32 257/359 |
| 2005/0001963 A1* | 1/2005 | Yokoyama | G02F 1/13439 349/122 |
| 2008/0136318 A1* | 6/2008 | Kashiwabara | H01L 51/5265 313/504 |

(Continued)

*Primary Examiner* — Ngan Ngo
(74) *Attorney, Agent, or Firm* — Andrew C. Cheng (57) ABSTRACT

The invention provides a color display device structure, including a substrate (1), an anode (21), a thin film transistor array (23), a hole injection layer (24), a hole transport layer (25), a light emitting layer (26), an electron transport layer (27), a cathode (28), a cover plate (3), a color conversion layer (4) formed on the inner side of the cover plate (3), and a sealant (6). The light emitting layer (26) is a blue and green light emitting layer (26). The color conversion layer (4) includes a blue filter unit (41), a green filter unit (43) and a red conversion unit (45) separated one another. The blue light and the green light emitted by the blue and green light emitting layer (26) is filtered to become blue light by the blue filter unit (41). The blue light and the green light emitted by the blue and green light emitting layer (26) is filtered to become green light by the green filter unit (43). The blue light and the green light emitted by the blue and green light emitting layer (26) is converted to red light by the red conversion unit (45). The color display is achieved by the color display device structure. The color display device structure is manufactured by a simple production process, and has the features of high color purity, good emitting efficiency, high stability, ultra-thin, and so on.

11 Claims, 6 Drawing Sheets

(56) References Cited

U.S. PATENT DOCUMENTS

| | | | |
|---|---|---|---|
| 2010/0193772 A1* | 8/2010 | Morosawa | H01L 29/7869 257/40 |
| 2012/0056162 A1* | 3/2012 | Wada | C07F 9/5045 257/40 |
| 2012/0242218 A1* | 9/2012 | Yoshinaga | H01L 27/3213 313/504 |
| 2013/0119416 A1* | 5/2013 | Yoneda | H01L 27/3211 257/89 |
| 2013/0281693 A1* | 10/2013 | Inoue | H01L 51/0085 544/225 |
| 2014/0103368 A1* | 4/2014 | Hatano | H01L 27/3246 257/88 |
| 2014/0206117 A1* | 7/2014 | Sonoda | H01L 51/0023 438/29 |
| 2015/0021569 A1* | 1/2015 | Lee | G02B 5/20 257/40 |
| 2015/0123085 A1* | 5/2015 | Kim | H01L 51/5284 257/40 |
| 2015/0357392 A1* | 12/2015 | You | H01L 27/3269 257/40 |
| 2015/0364726 A1* | 12/2015 | Kim | H01L 51/56 438/4 |

* cited by examiner

COLOR DISPLAY DEVICE STRUCTURE

BACKGROUND OF THE INVENTION

1. Field of the Invention

The present invention relates to the field of display technology, and more particularly, to a color display device structure and manufacturing method thereof.

2. Description of Related Art

The organic light emitting diode display (Organic Light Emitting Diode, OLED) is a very promising flat panel display technology, which not only has a very excellent display performance, but also has self-luminous, simple structure, ultra-thin, fast response, wide viewing angle, low power consumption, flexible display and other features, known as the "Dream monitor". To be coupled with the investment of OLED in production equipment is much smaller than that of the liquid crystal display (Liquid Crystal Display, LCD), OLED has got the attention of the major display manufacturers and become the main force of third-generation display.

Currently, there are several color OLED technology roadmap. One is RGB (Red, Green, Blue, RGB) three-color light, Samsung company representative. This technique is only applicable to organic small molecules material easily sublimated. The advantage of the technology is mature, easy to operate. However, because of the need for high accuracy and precision of the mask alignment in the preparation of high-resolution display, it results in low productivity and high cost, and because of the life of the three primary colors, the excitation rate, and the large attenuation difference, it results in a color cast of the color display device.

The other is white +RGB filters (Color Filter, CF) technology to LG company representative. Since the CF technique of the LCD can be used, the mask alignment is not required, which greatly simplifies the vapor deposition process, and thus can reduce production cost and manufacture large-size high-resolution OLED. However, since most of the light energy is absorbed by the filter, only about 30% of the light is transmitted, so that the white light emitting material requires high performance, otherwise the efficiency of the display device is low, and is generally used for small molecule OLED display.

The third is that a blue OLED luminesce, through a green and red light color conversion method (Color conversion method, CCM) and the red and green light material excited by blue light, to obtain three primary colors, red, green and blue, achieving color display. Since the same production technology as that of the color filter can be used, it increases the pixel density, and can achieve a higher yield. But the blue material is the bottleneck restricting this technology. At this stage, it is generally only used for the preparation of small molecule OLED.

The semiconductor nanocrystals (semiconductor nanocrystals, NCs) has the size of 1-100 nm. Due to the size of the semiconductor nanocrystals smaller than the exciton Bohr radius of its material, that exhibits strong quantum confinement effect. The quasi-continuous energy band evolves into the discrete energy level structure similar to that of a molecule, showing a new material properties, also known as quantum dots (quantum dots, QDs).

Since the excitation of the external energy (photoluminescence, electroluminescence, cathodoluminescence, etc.), electrons are transited from the ground state to the excited state. The electrons and holes in the excited state may form excitons. The electrons and holes combine and ultimately relax to the ground state. The excess energy is released through the combination and relaxation processes, which may emit photons by radiative combination.

Quantum dots light emitting diode display (Quantum Dots Light Emitting Diode, QD-LED) has important commercial applications, arousing intense research interest in the last decade. Indeed, QD-LEDs have many advantages as compared with OLED: (1) because the line width of light emitted by the quantum dots is between 20-30 nm, relative to luminescence, longer than 50 nm, of OLED, the FWHM (Full Width at Half Maximum, FWHM) is narrow, which for color purity of the screen plays a key role; (2) the inorganic material with respect to the organic material exhibits a better thermal stability. When the device is in a high current density or high luminance, Joule heat is the main reason for degradation of the device. Because of the excellent thermal stability, the inorganic material-based devices will exhibit a long life; (3) since the lives of the different organic materials of red, green and blue color are different one another, the color of the OLED display will change over time. However, by using a material to synthesize the quantum dots of different sizes, due to the quantum confinement effect, the three primary colors light can be emitted. The same kind of material may exhibit a similar degradation of life; (4) QD-LED can emit infrared light, and the emission wavelength of an organic material is generally less than 1 micron; (5) there is no limitation to the spin statistics for quantum dots, and the external quantum efficiency (External Quantum Efficiency, EQE) may reach 100%.

QD-LED can be divided into organic-inorganic hybrid devices and full-inorganic devices. The former can achieve high brightness and flexible production. The latter has an advantage in terms of stability of the device. But reports of the QD-LED are relatively small, now.

It is therefore necessary to develop a new, simple production process to manufacture a thin color display device structures with high color purity, good emitting efficiency, and high stability.

SUMMARY OF THE INVENTION

The purpose of the present invention is to provide a color display device structure in which the structure of a white light +RGB filter is improved. The color display device structure is manufactured by a simple production process, and has the features of high color purity, good emitting efficiency, high stability, ultra-thin, and so on.

To achieve the above object, the invention provides a color display device structure, comprising a substrate, an anode formed on the substrate, a thin film transistor array formed on the anode, a hole injection layer formed on the thin film transistor array, a hole transport layer formed on the hole injection layer, a light emitting layer formed on the hole transport layer, an electron transport layer formed on the light emitting layer, a cathode formed on the electron transport layer, a cover plate set above the cathode and bonded to the substrate, a color conversion layer formed on the inner side of the cover plate, and a sealant used to encapsulate the substrate and the cover plate. The light emitting layer is a blue and green light emitting layer. The color conversion layer includes a blue filter unit, a green filter unit and a red conversion unit separated one another. The blue light and the green light emitted by the blue and green light emitting layer is filtered to become blue light by the blue filter unit. The blue light and the green light emitted by the blue and green light emitting layer is filtered to become green light by the green filter unit. The blue light and the green light emitted by the blue and green light emitting layer is converted to red light by the red conversion unit. The color display is achieved by the color display device structure.

The color conversion layer further comprises a white conversion unit. The white conversion unit includes a red conversion portion and a transparent portion. The blue light and the green light emitted by the blue and green light emitting layer is converted to red light by the red conversion portion. The blue light and the green light emitted by the blue and green light emitting layer passes through the transparent portion and combines with the converted red light to become white light.

The material of the blue and green light emitting layer may be an organic light emitting material. The blue and green light emitting layer is formed by a vacuum thermal evaporation deposition method or a solution deposition method.

The organic light emitting material uses an organic host material doped with an organic blue-light guest material and an organic green-light guest material. The organic host material may be 4,4',4"-tris(carbazol-9-yl) triphenylamine or 2,4, 6-tris(9H-carbazol-9-yl)-1,3,5-triazine. The organic blue-light guest material may be 9,10-di(2-naphthyl) anthracene. The organic green-light guest material may be tris(2-phenylpyridine) iridium.

The material of the blue and green light emitting layer comprises blue-light quantum dots and green-light quantum dots. The blue and green light emitting layer is formed by a solution deposition method.

The blue-light quantum dots may be quantum dots of cadmium zinc sulfide, cadmium selenide/zinc sulfide, or nano silicon nitride. The green-light quantum dots may be quantum dots of cadmium selenide/zinc sulfide or zinc selenide doped with copper ions.

The material of the blue and green light emitting layer further includes an organic host material. The organic host material may be 4,4',4"-tris(carbazol-9-yl) triphenylamine or 2,4,6,-tris(9H-carbazol-9-yl)-1,3,5-triazine. The organic host material is mixed with particles of the blue-light quantum dots and the green-light quantum dots and a solvent to form the blue and green light emitting layer by coating and evaporating the solvent.

The material of the color conversion layer may be an organic fluorescent material.

The material of the color conversion layer may be quantum dots. The material of the blue filter unit may be quantum dots of cadmium zinc sulfide, cadmium selenide/zinc sulfide, or nano silicon nitride. The material of the green filter unit may be quantum dots of cadmium selenide/zinc sulfide or zinc selenide doped with copper ions. The material of the red conversion unit may be quantum dots of cadmium selenide/cadmium sulfide/zinc sulfide.

A surface of the blue filter unit, a surface of the green filter unit and a surface of the red conversion unit have a surface coating agent. The surface coating agent may be stearic acid, trioctylphosphine oxide, or polymethyl methacrylate. The quantum dots is mixed with the surface coating agent and a solvent to form the blue filter unit, the green filter unit and the red conversion unit by coating and evaporating the solvent.

The color display device structure of the present invention, by the blue and green light emitting layer and the color conversion layer including the blue filter unit, the green filter unit and the red conversion unit, achieves color display and reduces the thickness of the light emitting layer and the thickness of the color display device. The material of the blue and green light emitting layer and the color conversion layer may be the organic material or the quantum dots, so that the color display device has the features of high color purity, good emitting efficiency, high stability, and so on. Moreover, because the fine mask alignment is not required when making the blue and green light emitting layer, the match of two light emitting materials are relatively easy, so that the production process of the color display device structure is simple, and the cost is low.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Following exemplary embodiments with reference of figures are only used for describing the disclosure in detail. However, the disclosure can also be achieved through different implementations, which is not limited to the following embodiments. In the figures referred to herein, sizes and relative sizes of different layers are probably exaggerated for clarity of illustration and are not necessarily drawn to scale.

Figure 1:
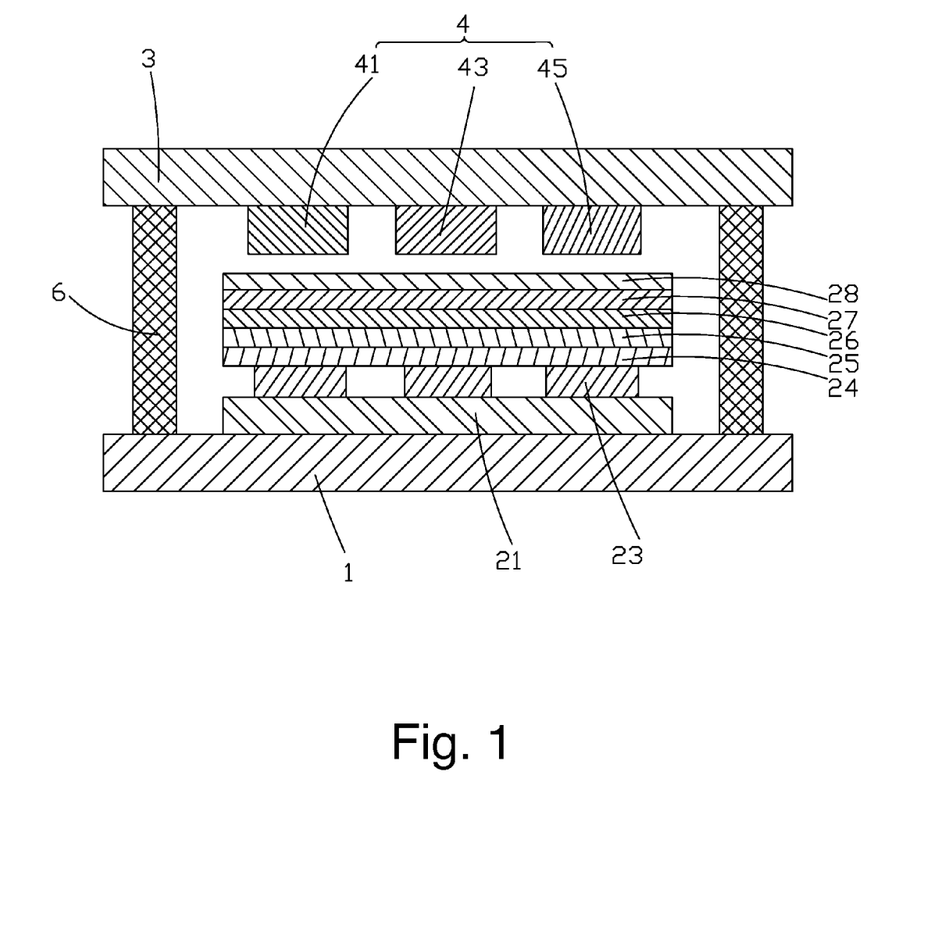
FIG. 1 is a schematic diagram of the color display device structure according to the first embodiment of the present invention.

Please refer to FIG. 1. FIG. 1 is a schematic diagram of the color display device structure according to the first embodiment of the present invention. The color display device structure includes a substrate 1, an anode 21 formed on the substrate 1, a thin film transistor (Thin Film Transistor, TFT) array 23 formed on the anode 21, a hole injection layer 24 (Hole Injection Layer, HIL) formed on the thin film transistor array 23, a hole transport layer (Hole Transport Layer, HTL) 25 formed on the hole injection layer 24, a light emitting layer 26 formed on the hole transport layer 25, an electron transport layer 27 (Electron Transport Layer, ETL) formed on the light emitting layer 26, a cathode 28 formed on the electron transport layer 27, a cover plate 3 set above the cathode 28 and bonded to the substrate 1, a color conversion layer 4 formed on the inner side of the cover plate 3, and a sealant 6 used to encapsulate the substrate 1 and the cover plate 3.

The light emitting layer 26 is a blue and green light emitting layer 26. The color conversion layer 4 includes a blue filter unit 41, a green filter unit 43 and a red conversion unit 45 separated one another. The blue light and the green light emitted by the blue and green light emitting layer 26 is filtered to become blue light by the blue filter unit 41. The blue light and the green light emitted by the blue and green light emitting layer 26 is filtered to become green light by the green filter unit 43. The blue light and the green light emitted by the blue and green light emitting layer 26 is converted to red light by the red conversion unit 45. The color display device structure achieves color display and reduces the thickness of the light emitting layer and the thickness of the color display device.

Because the blue and green light emitting layer 26 is not red, green and blue light-emitting structure but similar to the surface-emitting layer of the white OLED, the fine mask alignment is not required when making the blue and green light emitting layer 26. Furthermore, the match of the blue and green light emitting materials is easier than that of the red, blue and green light emitting materials. Therefore, the production process of the color display device structure is simple, and the cost is low.

The substrate 1 and the cover plate 3 each may be a glass plate or a flexible material. At least one of the substrate 1 and the cover plate 3 must be light-transmissive. Preferably, the substrate 1 and the cover plate 3 are glass plates. The sealant 6 can prevent external moisture and oxygen from entering the interior, to protect the internal components.

The material of the hole injection layer 24 is polyethylene dioxythiophene (PEDOT). The material of the hole transport layer 25 is poly triphenylamine (poly-TPD). The material of the electron transport layer 27 is eight hydroxyl quinoline aluminum (Alq3).

The material of the blue and green light emitting layer 26 may be an organic light emitting material or blue-light quantum dots and green-light quantum dots, When the material of the blue and green light emitting layer 26 is the organic light emitting material, the blue and green light emitting layer 26 is formed by a vacuum thermal evaporation deposition method or a solution deposition method.

The organic light emitting material uses an organic host material doped with an organic blue-light guest material and an organic green-light guest material. The organic host material may be 4,4',4''-tris(carbazol-9-yl) triphenylamine (TCTA), of the molecular structure:

or 2,4,6-tris(9H-carbazol-9-yl)-1,3,5-triazine (TRZ), of the molecular structure:

The organic blue-light guest material may be 9,10-di(2-naphthyl) anthracene (ADN), of the molecular structure:

The organic green-light guest material may be tris(2-phenylpyridine) iridium (Ir(ppy) 3), of the molecular structure:

When the material of the blue and green light emitting layer 26 uses the blue-light quantum dots and the green-light quantum dots, the color display device has the features of high color purity, good emitting efficiency, and high stability. The blue and green light emitting layer 26 is formed by the solution deposition method.

The blue-light quantum dots may be quantum dots of cadmium zinc sulfide (ZnCdS), cadmium selenide/zinc sulfide (CdSe/ZnS), or nano silicon nitride ($SiN_4$). The green-light quantum dots may be quantum dots of cadmium selenide/zinc sulfide or zinc selenide doped with copper ions ($ZnSe:Cu^{2+}$).

The material of the blue and green light emitting layer 26 may use the layer having the blue-light quantum dots and the green-light quantum dots, or the organic host material doped with the blue-light quantum dots and the green-light quantum dots. The organic host material may be 4,4',4''-tris(carbazol-9-yl) triphenylamine or 2,4,6,-tris(9H-carbazol-9-yl)-1,3,5-triazine. The organic host material is mixed with particles of the blue-light quantum dots and the green-light quantum dots and a solvent to form the blue and green light emitting layer 26 by coating and evaporating the solvent.

The material of the color conversion layer 4 may be an organic fluorescent material, such as the material of a color filter currently used in the LCD manufacturing process.

The material of the color conversion layer 4 may also be quantum dots, making the color display device with the features of high color purity, good emitting efficiency, and high stability. The material of the blue filter unit 41 may be quantum dots of cadmium zinc sulfide, cadmium selenide/zinc sulfide, or nano silicon nitride. The material of the green filter unit 43 may be quantum dots of cadmium selenide/zinc sulfide or zinc selenide doped with copper ions. The material of the red conversion unit 45 may be quantum dots of cadmium selenide/cadmium sulfide/zinc sulfide (CdSe/CdS/ZnS).

Because the quantum dots are nanoparticles, zero-dimensional materials, and surfactants large, prone to agglomeration, resulting in oxidation and fluorescence quenching. A surface of the blue filter unit 41, a surface of the green filter unit 43 and a surface of the red conversion unit 45 each have a surface coating agent to prevent the agglomeration and oxidation. The surface coating agent may be stearic acid, trioctylphosphine oxide, or polymethyl methacrylate (PMMA). The quantum dots is mixed with the surface coating agent and a solvent to form the blue filter unit 41, the green filter unit 43 and the red conversion unit 45 by coating and evaporating the solvent.

Figure 2:
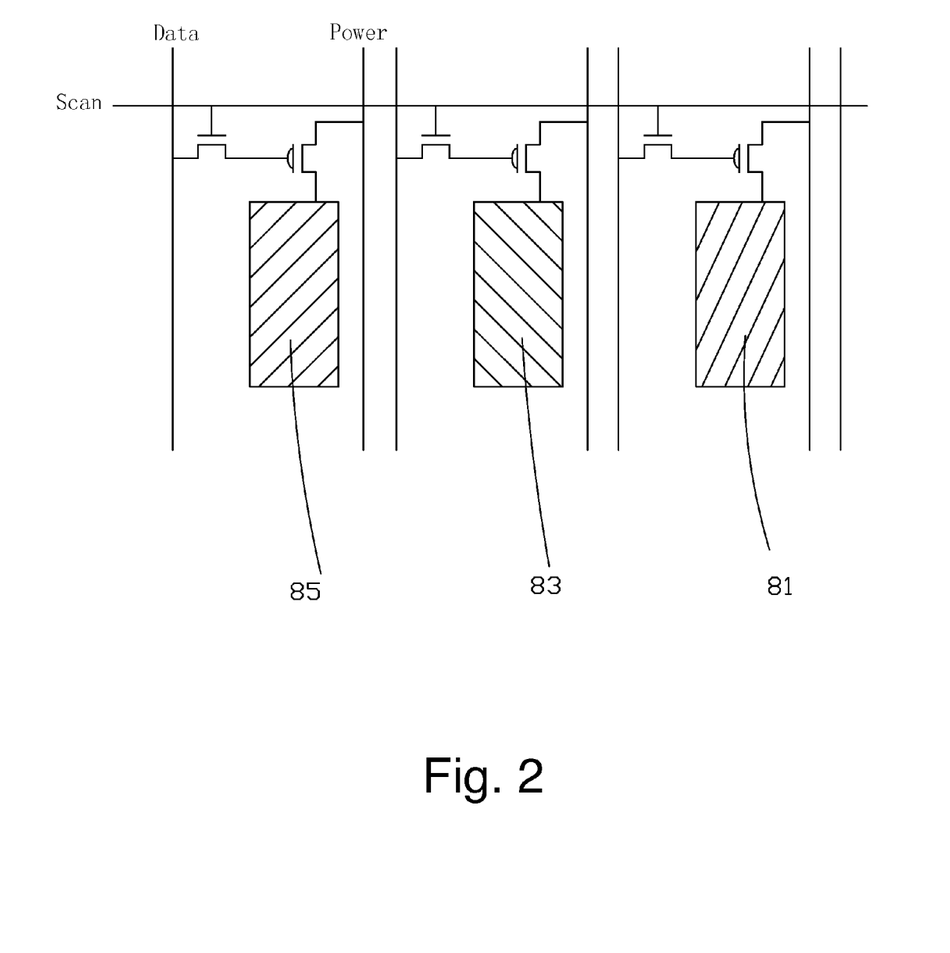
FIG. 2 is a schematic diagram of a driving circuit of a pixel in FIG. 1.

See FIG. 2, in this first embodiment, the blue filter unit 41, the green filter unit 43 and the red converting unit 45 corresponds to a pixel. The pixel includes a red sub-pixel 85, a green sub-pixel 83, and a blue sub-pixel 81. The red conversion unit 45 corresponds to the red sub-pixel 85 of the pixel. The green filter unit 43 corresponds to the green sub-pixel 83 of the pixel. The blue filter unit 41 corresponds to the blue sub-pixel 81 of the pixel. The red sub-pixel 85, the green sub-pixel 83, and the blue sub-pixels 81 each correspond to a TFT, to control whether the regions of the blue and green light emitting layer 26, respectively corresponding to the sub-pixels emit light or not.

When the TTF controls the region of the blue and green light emitting layer 26, corresponding to the blue sub-pixel 81, to emit light, the blue light and the green light emitted by the blue and green light emitting layer 26 is filtered to become blue light by the blue filter unit 41. When the TTF controls the region of the blue and green light emitting layer 26, corresponding to the green sub-pixel 83, to emit light, the blue light and the green light emitted by the blue and green light emitting layer 26 is filtered to become green light by the green filter unit 43. When the TTF controls the region of the blue and green light emitting layer 26, corresponding to the red sub-pixel 85, to emit light, the blue light and the green light emitted by the blue and green light emitting layer 26 is converted to red light by the red conversion unit 45. Thereby, the color display device structure achieves the red, green, and blue color display and achieves color display by superimpose the red, green, and blue colors.

Figure 3:
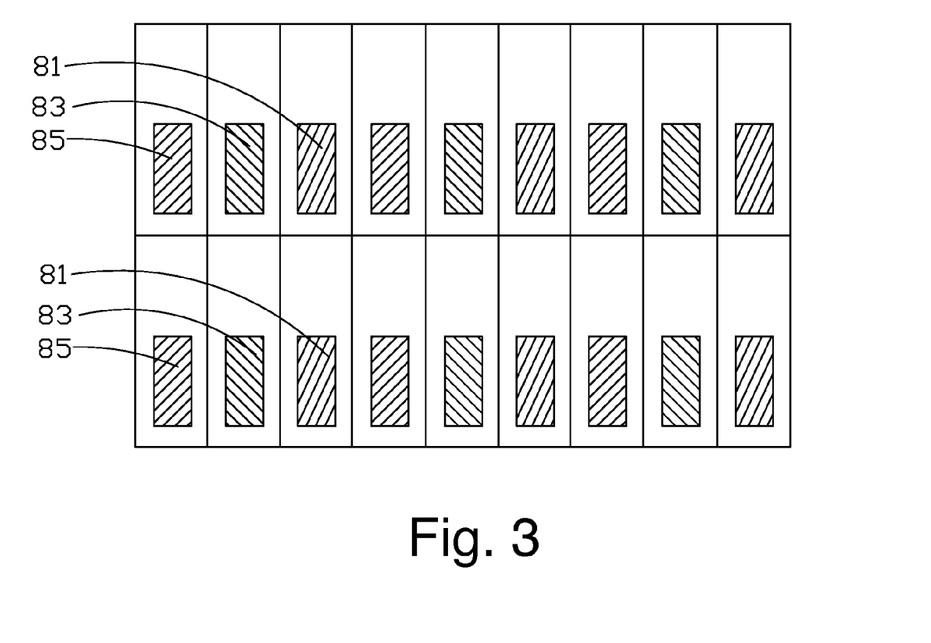
FIG. 3 is a schematic diagram of a pixel arrangement of the color display device structure according to the first embodiment of the present invention.

Refer to FIG. 3. FIG. 3 is a schematic diagram of a pixel arrangement of the color display device structure according to the first embodiment of the present invention. The arranged ways of the upper and lower pixel lines adjacent to each are the same. The red sub-pixel 85, the green sub-pixel 83, the blue sub-pixel 81 are sequentially spaced in the horizontal direction from left to right.

Figure 4:
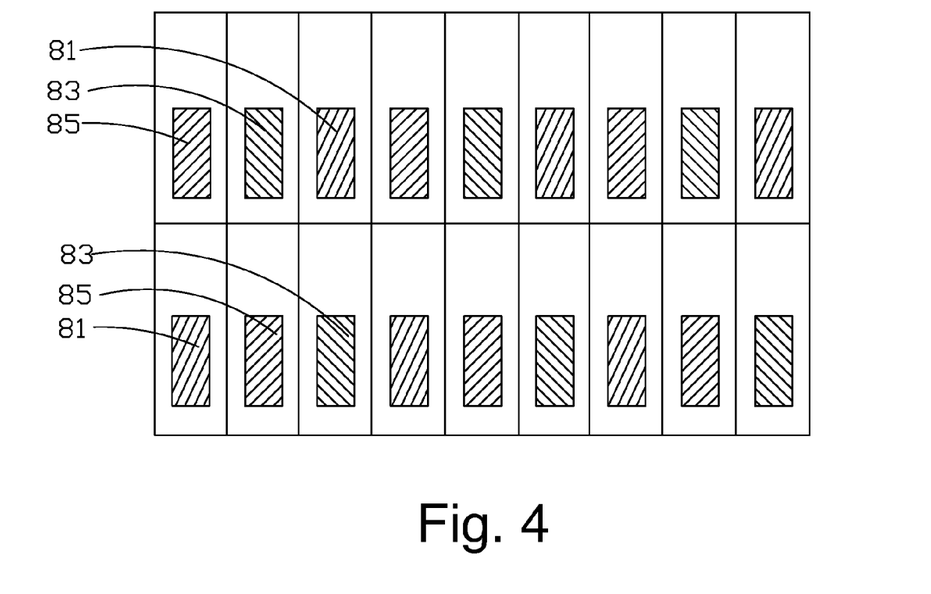
FIG. 4 is a schematic diagram of another pixel arrangement of the color display device structure according to the first embodiment of the present invention.

Refer to FIG. 4. FIG. 4 is a schematic diagram of another pixel arrangement of the color display device structure according to the first embodiment of the present invention. The arranged ways of the upper and lower pixel lines adjacent to each are different. The arranged way of the upper pixel line is that the red sub-pixel 85, the green sub-pixel 83 and the blue sub-pixel 81 are sequentially spaced in the horizontal direction from left to right. The arranged way of the lower pixel line is that the blue sub-pixel 81, the red sub-pixel 85 and the green sub-pixel 83 are sequentially spaced in the horizontal direction from left to right. The invention can be applied to a color display device with the different type of the arranged way of the pixel line, not limited to the above two types.

Figure 5:
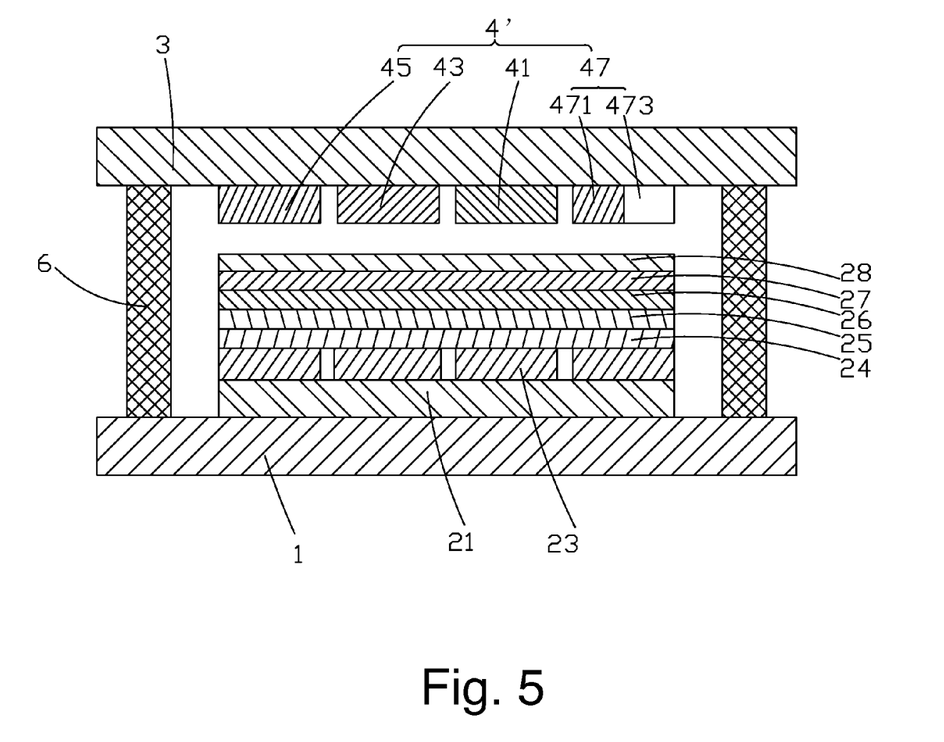
FIG. 5 is a schematic diagram of the color display device structure according to the second embodiment of the present invention.

Refer to FIG. 5. FIG. 5 is a schematic diagram of the color display device structure according to the second embodiment of the present invention. The second embodiment differs from the above first embodiment in that the color conversion layer 4' in addition to blue filter unit 41, green filter unit 43 and the red conversion unit 45, further includes white conversion unit 47. The white conversion unit 47 includes a red conversion portion 471 and a transparent portion 473. The blue light and the green light emitted by the blue and green light emitting layer 26 is converted to red light by the red conversion portion 471. The blue light and the green light emitted by the blue and green light emitting layer 26 passes through the transparent portion 473 and combines with the converted red light to become white light.

As an alternative solution, the white conversion unit 47 may be a mixed type of the blue-light CF+green-light CF+red-light CCM. The blue and green light emitted from the blue and green light emitting layer 26 is converted to white light through the white conversion unit 47.

Figure 6:
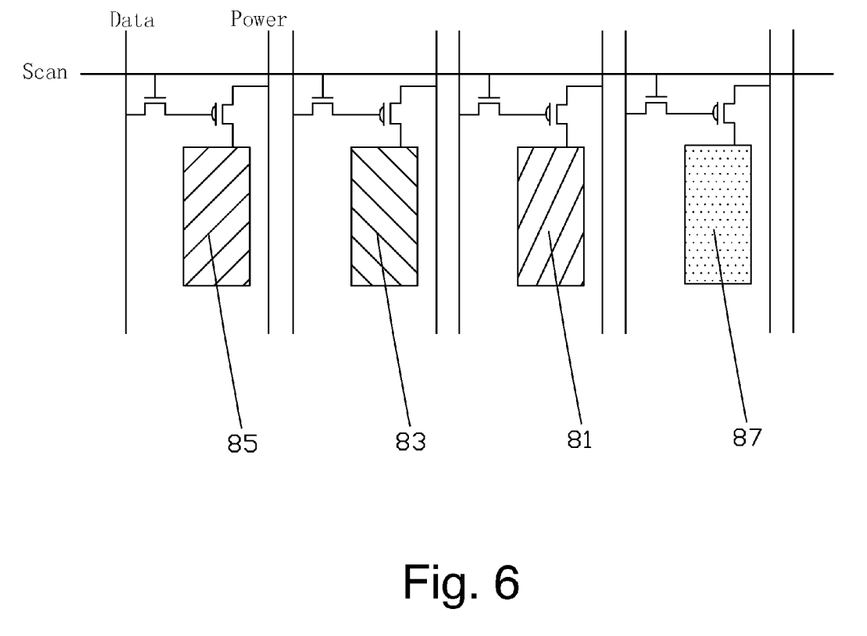
FIG. 6 is a schematic diagram of a driving circuit of a pixel in FIG. 5.

See FIG. 6. In the second embodiment, the blue filter unit 41, the green filter unit 43, the red conversion unit 45 and the white converting unit 47 correspond to a pixel. The pixel includes a red sub-pixel 85, a green sub-pixel 83, a blue sub-pixel 81 and a white sub-pixel 87. The red conversion unit 45 corresponds to the red sub-pixel 85 of the pixel. The green filter unit 43 corresponds to the green sub-pixel 83 of the pixel. The blue filter unit 41 corresponds to the blue sub-pixel 81 of the pixel. The white conversion unit 47 corresponds to the white sub-pixel 87 of the pixel. The red sub-pixel 85, the green sub-pixel 83, the blue sub-pixel 81 and the white sub-pixel 87, each corresponds to a TFT, to control whether the regions of the blue and green light emitting layer 26, respectively corresponding to the sub-pixels emit light or not.

Figure 7:
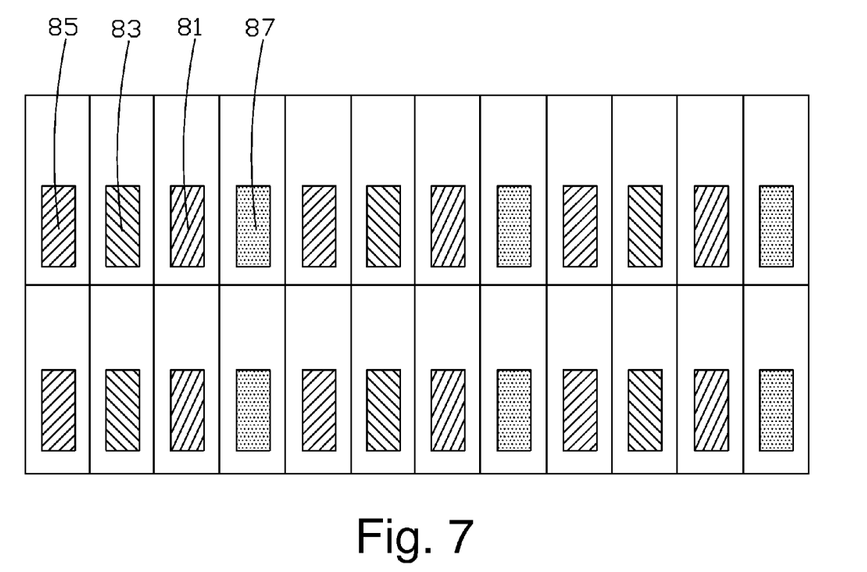
FIG. 7 is a schematic diagram of a pixel arrangement of the color display device structure according to the second embodiment of the present invention.

See FIG. 7. In the second embodiment, the arranged ways of the upper and lower pixel lines adjacent to each are the same. The red sub-pixel 85, the green sub-pixel 83, the blue sub-pixel 81 and the white sub-pixel 87 are sequentially spaced in the horizontal direction from left to right.

Figure 8:
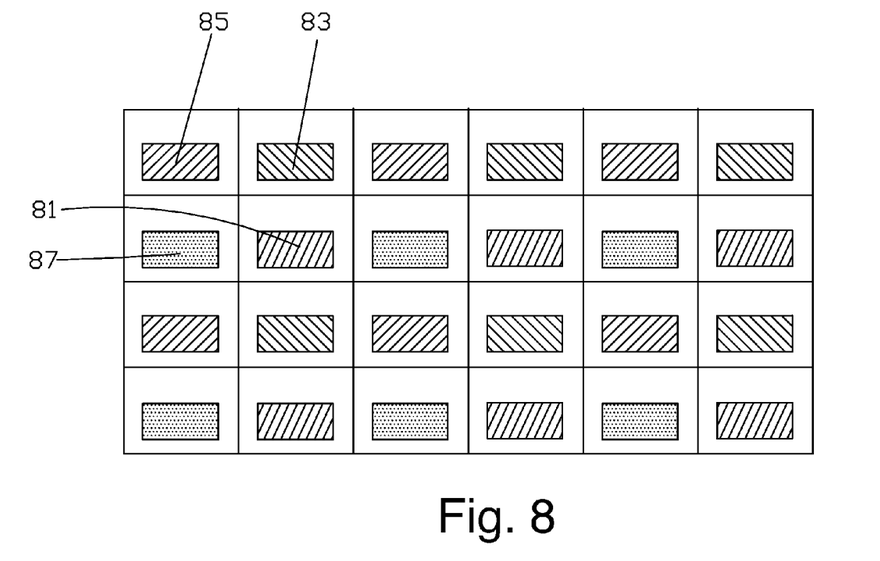
FIG. 8 is a schematic diagram of another pixel arrangement of the color display device structure according to the second embodiment of the present invention.

See FIG. 8. It is another arranged way in the second embodiment. The red sub-pixel 85, the green sub-pixel 83, the blue sub-pixel 81 and the white sub-pixel 87 are sequentially spaced in the clockwise direction.

The color display device structure of the present invention, by the blue and green light emitting layer and the color conversion layer including the blue filter unit, the green filter unit and the red conversion unit, achieves color display and reduces the thickness of the light emitting layer and the thickness of the color display device. The material of the blue and green light emitting layer and the color conversion layer may be the organic material or the quantum dots, so that the color display device has the features of high color purity, good emitting efficiency, high stability, and so on. Moreover, because the fine mask alignment is not required when making the blue and green light emitting layer, the match of two light emitting materials are relatively easy, so that the production process of the color display device structure is simple, and the cost is low.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A color display device structure, comprising a substrate, an anode formed on the substrate, a thin film transistor array formed on the anode, a hole injection layer formed on the thin film transistor array, a hole transport layer formed on the hole injection layer, a light emitting layer formed on the hole transport layer, an electron transport layer formed on the light emitting layer, a cathode formed on the electron transport layer, a cover plate set above the cathode and bonded to the substrate, a color conversion layer formed on the inner side of the cover plate, and a sealant used to encapsulate the substrate and the cover plate, wherein the light emitting layer is a blue and green light emitting layer, the color conversion layer includes a blue filter unit, a green filter unit and a red conversion unit separated one another, the blue light and the green light emitted by the blue and green light emitting layer is filtered to become blue light by the blue filter unit, the blue light and the green light emitted by the blue and green light emitting layer is filtered to become green light by the green filter unit, and the blue light and the green light emitted by the blue and green light emitting layer is converted to red light by the red conversion unit, in order to achieve color display.

2. The color display device structure according to claim 1, wherein the color conversion layer further comprises a white conversion unit, the white conversion unit includes a red conversion portion and a transparent portion, the blue light and the green light emitted by the blue and green light emitting layer is converted to red light by the red conversion portion, and the blue light and the green light emitted by the blue and green light emitting layer passes through the transparent portion and combines with the converted red light to become white light.

3. The color display device structure according to claim 1, wherein the material of the blue and green light emitting layer includes an organic light emitting material, and the blue and green light emitting layer is formed by a vacuum thermal evaporation deposition method or a solution deposition method.

4. The color display device structure according to claim 3, wherein the organic light emitting material uses an organic host material doped with an organic blue-light guest material and an organic green-light guest material, the organic host material includes 4,4',4"-tris(carbazol-9-yl) triphenylamine or 2,4,6-tris(9H-carbazol-9-yl)-1,3,5-triazine, the organic blue-light guest material includes 9,10-di(2-naphthyl) anthracene, and the organic green-light guest material includes tris(2-phenylpyridine) iridium.

5. The color display device structure according to claim 1, wherein the material of the blue and green light emitting layer comprises blue-light quantum dots and green-light quantum dots, and the blue and green light emitting layer is formed by a solution deposition method.

6. The color display device structure according to claim 5, wherein the blue-light quantum dots are quantum dots of cadmium zinc sulfide, cadmium selenide/zinc sulfide, or nano silicon nitride, and the green-light quantum dots are quantum dots of cadmium selenide/zinc sulfide or zinc selenide doped with copper ions.

7. The color display device structure according to claim 5, wherein the material of the blue and green light emitting layer further includes an organic host material, the organic host material includes 4,4',4"-tris(carbazol-9-yl) triphenylamine or 2,4,6,-tris(9H-carbazol-9-yl)-1,3,5-triazine, and the organic host material is mixed with particles of the blue-light quantum dots and the green-light quantum dots and a solvent to form the blue and green light emitting layer by coating and evaporating the solvent.

8. The color display device structure according to claim 1, wherein the material of the color conversion layer includes an organic fluorescent material.

9. The color display device structure according to claim 1, wherein the material of the color conversion layer includes quantum dots, the material of the blue filter unit includes quantum dots of cadmium zinc sulfide, cadmium selenide/zinc sulfide, or nano silicon nitride, the material of the green filter unit includes quantum dots of cadmium selenide/zinc sulfide or zinc selenide doped with copper ions, and the material of the red conversion unit includes quantum dots of cadmium selenide/cadmium sulfide/zinc sulfide.

10. The color display device structure according to claim 8, wherein a surface of the blue filter unit, a surface of the green filter unit and a surface of the red conversion unit have a surface coating agent, the surface coating agent includes stearic acid, trioctylphosphine oxide, or polymethyl methacrylate, and the quantum dots is mixed with the surface coating agent and a solvent to form the blue filter unit, the green filter unit and the red conversion unit by coating and evaporating the solvent.

11. A color display device structure, comprising a substrate, an anode formed on the substrate, a thin film transistor array formed on the anode, a hole injection layer formed on the thin film transistor array, a hole transport layer formed on the hole injection layer, a light emitting layer formed on the hole transport layer, an electron transport layer formed on the light emitting layer, a cathode formed on the electron transport layer, a cover plate set above the cathode and bonded to the substrate, a color conversion layer formed on the inner side of the cover plate, and a sealant used to encapsulate the substrate and the cover plate;

wherein the light emitting layer is a blue and green light emitting layer, the color conversion layer includes a blue filter unit, a green filter unit and a red conversion unit separated one another, the blue light and the green light emitted by the blue and green light emitting layer is filtered to become blue light by the blue filter unit, the blue light and the green light emitted by the blue and green light emitting layer is filtered to become green light by the green filter unit, and the blue light and the green light emitted by the blue and green light emitting layer is converted to red light by the red conversion unit, in order to achieve color display;

wherein the material of the blue and green light emitting layer includes an organic light emitting material, and the blue and green light emitting layer is formed by a vacuum thermal evaporation deposition method or a solution deposition method;

wherein the organic light emitting material uses an organic host material doped with an organic blue-light guest material and an organic green-light guest material, the organic host material includes 4,4',4"-tris(carbazol-9-yl) triphenylamine, or 2,4,6-tris(9H-carbazol-9-yl)-1,3,5-triazine, the organic blue-light guest material includes 9,10-di(2-naphthyl) anthracene, and the organic green-light guest material includes tris(2-phenylpyridine) iridium;

wherein the material of the blue and green light emitting layer comprises blue-light quantum dots and green-light quantum dots, and the blue and green light emitting layer is formed by a solution deposition method;

wherein the blue-light quantum dots are quantum dots of cadmium zinc sulfide, cadmium selenide/zinc sulfide, or nano silicon nitride, and the green-light quantum dots are quantum dots of cadmium selenide/zinc sulfide or zinc selenide doped with copper ions;

wherein the material of the blue and green light emitting layer further includes an organic host material, the organic host material includes 4,4',4"-tris(carbazol-9-yl) triphenylamine, or 2,4,6,-tris(9H-carbazol-9-yl)-1,3,5-triazine, and the organic host material includes mixed with particles of the blue-light quantum dots and the green-light quantum dots and a solvent to form the blue and green light emitting layer by coating and evaporating the solvent;

wherein the material of the color conversion layer includes an organic fluorescent material;

wherein the material of the color conversion layer includes quantum dots, the material of the blue filter unit includes quantum dots of cadmium zinc sulfide, cadmium selenide/zinc sulfide, or nano silicon nitride, the material of the green filter unit includes quantum dots of cadmium selenide/zinc sulfide or zinc selenide doped with copper ions, and the material of the red conversion unit includes quantum dots of cadmium selenide/cadmium sulfide/zinc sulfide;

wherein a surface of the blue filter unit, a surface of the green filter unit and a surface of the red conversion unit have a surface coating agent, the surface coating agent includes stearic acid, trioctylphosphine oxide, or polymethyl methacrylate, and the quantum dots is mixed with the surface coating agent and a solvent to form the blue filter unit, the green filter unit and the red conversion unit by coating and evaporating the solvent.

* * * * *